(12) United States Patent
Benedikt et al.

(10) Patent No.: US 10,347,566 B2
(45) Date of Patent: Jul. 9, 2019

(54) CARRIER AND CLIP EACH HAVING SINTERABLE, SOLIDIFIED PASTE FOR CONNECTION TO A SEMICONDUCTOR ELEMENT, CORRESPONDING SINTERING PASTE, AND CORRESPONDING PRODUCTION METHOD AND USE

(71) Applicant: HERAEUS DEUTSCHLAND GMBH & CO. KG, Hanau (DE)

(72) Inventors: Michael Benedikt, Neuberg (DE); Thomas Krebs, Mömbris (DE); Michael Schäfer, Künzell (DE); Wolfgang Schmitt, Rodgau (DE); Andreas Hinrich, Freigericht (DE); Andreas Klein, Freigericht (DE); Alexander Brand, Elsenfeld (DE); Martin Bleifuss, Kahl (DE)

(73) Assignee: HERAEUS DEUTSCHLAND GMBH & CO. KG, Hanau (DE)

( * ) Notice: Subject to any disclaimer, the term of this patent is extended or adjusted under 35 U.S.C. 154(b) by 120 days.

(21) Appl. No.: 15/129,250

(22) PCT Filed: Mar. 26, 2015

(86) PCT No.: PCT/EP2015/056596
§ 371 (c)(1),
(2) Date: Sep. 26, 2016

(87) PCT Pub. No.: WO2015/144833
PCT Pub. Date: Oct. 1, 2015

(65) Prior Publication Data
US 2017/0117209 A1     Apr. 27, 2017

(30) Foreign Application Priority Data
Mar. 26, 2014   (DE) .................. 10 2014 104 272

(51) Int. Cl.
*H01L 23/495* (2006.01)
*H01L 23/00* (2006.01)
*H01L 21/48* (2006.01)

(52) U.S. Cl.
CPC .... *H01L 23/49513* (2013.01); *H01L 21/4821* (2013.01); *H01L 23/49524* (2013.01);
(Continued)

(58) Field of Classification Search
CPC .......... H01L 23/49513; H01L 21/4821; H01L 23/49524; H01L 24/40; H01L 2224/40499; H01L 2224/40245; H01L 2224/4005
See application file for complete search history.

(56) References Cited

U.S. PATENT DOCUMENTS

| 2008/0145607 A1 | 6/2008 | Kajiwara et al. |
| 2009/0096100 A1 | 4/2009 | Kajiwara |

(Continued)

FOREIGN PATENT DOCUMENTS

| CN | 1961381 A | 5/2007 |
| CN | 102131353 A | 7/2011 |

(Continued)

OTHER PUBLICATIONS

International Preliminary Report on Patentability dated Sep. 27, 2016 for related application PCT/EP2015/056596, translation provided.

(Continued)

*Primary Examiner* — Kyoung Lee
(74) *Attorney, Agent, or Firm* — Hassan Abbas Shakir; Shakir Law PLLC

(57) ABSTRACT

A carrier and the clip are used to produce a packaging having a lead frame by connection to the chip using sintering of the solidified sintering pastes in one work step. The carrier may (Continued)

be a lead frame and a clip for at least one semiconductor element has at least one functional surface for connecting to the semiconductor element and a plurality of connections. The material of the earlier or of the clip includes a metal and a layer made of a solidified sintering paste. The sintering paste may contain silver and/or a silver compound. The sintering paste is arranged on the functional surface. The carrier or clip and the layer made of sintering paste form an intermediate product that can be connected to the semiconductor element.

17 Claims, 1 Drawing Sheet

(52) U.S. Cl.
CPC .. *H01L 23/49548* (2013.01); *H01L 23/49551* (2013.01); *H01L 24/27* (2013.01); *H01L 24/29* (2013.01); *H01L 24/40* (2013.01); *H01L 24/83* (2013.01); *H01L 24/84* (2013.01); *H01L 24/92* (2013.01); *H01L 24/32* (2013.01); *H01L 24/33* (2013.01); *H01L 24/37* (2013.01); *H01L 2224/2732* (2013.01); *H01L 2224/27318* (2013.01); *H01L 2224/27418* (2013.01); *H01L 2224/27505* (2013.01); *H01L 2224/27848* (2013.01); *H01L 2224/2939* (2013.01); *H01L 2224/29294* (2013.01); *H01L 2224/29295* (2013.01); *H01L 2224/29339* (2013.01); *H01L 2224/32245* (2013.01); *H01L 2224/33181* (2013.01); *H01L 2224/352* (2013.01); *H01L 2224/371* (2013.01); *H01L 2224/37639* (2013.01); *H01L 2224/4005* (2013.01); *H01L 2224/40095* (2013.01); *H01L 2224/40245* (2013.01); *H01L 2224/40499* (2013.01); *H01L 2224/73263* (2013.01); *H01L 2224/8384* (2013.01); *H01L 2224/8385* (2013.01); *H01L 2224/83192* (2013.01); *H01L 2224/83439* (2013.01); *H01L 2224/8484* (2013.01); *H01L 2224/8485* (2013.01); *H01L 2224/9221* (2013.01); *H01L 2924/181* (2013.01)

(56) References Cited

U.S. PATENT DOCUMENTS

| | | | |
|---|---|---|---|
| 2009/0273066 A1* | 11/2009 | Nikitin | H01L 23/49506 257/676 |
| 2010/0055839 A1 | 3/2010 | Nikitin | |
| 2010/0187678 A1 | 7/2010 | Kajiwara | |
| 2011/0084369 A1 | 4/2011 | Eder et al. | |
| 2012/0037688 A1* | 2/2012 | Kock | H01L 24/27 228/208 |
| 2012/0055978 A1 | 3/2012 | Schaeffer et al. | |
| 2013/0112261 A1 | 5/2013 | Lixin | |
| 2014/0001636 A1 | 1/2014 | Saito | |
| 2014/0013595 A1* | 1/2014 | Hong | H01L 24/89 29/825 |
| 2015/0123263 A1 | 5/2015 | Frueh et al. | |

FOREIGN PATENT DOCUMENTS

| | | |
|---|---|---|
| DE | 102009017853 A1 | 11/2009 |
| DE | 102009039227 A1 | 4/2010 |
| DE | 102009008926 A1 | 8/2010 |
| DE | 102010037439 A1 | 4/2011 |
| DE | 2428293 A2 | 3/2012 |
| DE | 102010044329 A1 | 3/2012 |
| DE | 102012207652 A1 | 11/2013 |
| EP | 2306796 A1 | 4/2011 |
| JP | 2009094341 A | 4/2009 |
| JP | 2012060114 A | 3/2012 |
| WO | 2005079353 A2 | 9/2005 |
| WO | 2010130235 A2 | 11/2010 |
| WO | 2013045367 A2 | 4/2013 |

OTHER PUBLICATIONS

English language translation of Written Opinion dated Sep. 27, 2016 for related application PCT/EP2015/056596.

Eisele R et al: "Reliable Chip Contact Joining", International Conference for Power Electronics, Intelligent Motion and Power Quality (PCIM), Nürnberg, Germany, May 13-15, 2009, pp. 723-728, ISBN: 978-3-8007-3158-9, cited in Written Opinion related application PCT/EP2015/056596.

Amro R et al: "Double-Sided Low-Temperature Joining Technique for Power Cycling Gapability at High Temperature", Power Electronics and Applications, 2005 European Conference on, Dresden, Germany, Sep. 11-14, 2005, IEEE, Piscataway, NJ, USA, pp. P1-P.10, 001: 10.1109/EPE.2005.219523, ISBN: 978-90-75815-09-2, cited in Written Opinion related application PCT/EP2015/056596.

International Search Report dated Jul. 2, 2015 for PCT/EP2015/056596, translation provided.

Written Opinion dated Oct. 1, 2015 for PCT/EP2015/056596.

Office Action dated Jan. 5, 2105 for related German Patent Application 10 2014 104 272.7 by the German Patent Office, partial machine translation provided.

Office Action dated May 3, 2018 for related Chinese Patent Application 2015800145412 issued by the Chinese State Intellectual Property Office, partial machine translation provided.

Office Action dated Jul. 31, 2018 by the Japanese Patent Office in related Japanese Patent Application 2016-558344, translation provided.

* cited by examiner

CARRIER AND CLIP EACH HAVING SINTERABLE, SOLIDIFIED PASTE FOR CONNECTION TO A SEMICONDUCTOR ELEMENT, CORRESPONDING SINTERING PASTE, AND CORRESPONDING PRODUCTION METHOD AND USE

BACKGROUND OF THE INVENTION

1. Field of the Invention

The invention relates to a carrier for at least one semiconductor element, which carrier has at least one functional surface for connection to the semiconductor element. The invention furthermore relates to a clip for at least one semiconductor element, which clip has at least one functional surface for connection to the semiconductor element. The invention furthermore relates to a method for producing such a carrier or such a clip, as well as to the use of the carrier or clip and to a sintering paste.

2. Discussion of the Related Art

A carrier of the type mentioned in the introduction is known, for example, from DE 10 2009 017 853 A1. During the production of the known carrier, the sintering paste is initially applied onto the lower side of the semiconductor element. The semiconductor element is then brought into contact with the functional surface of the carrier and temporarily fixed. The actual connection is then carried out by sintering the carrier to the semiconductor element using the paste. In this way, a layer system that is processed further as a semiconductor component is produced.

The carrier may, for example, be a so-called lead frame, and the semiconductor element may be a chip.

In the known method, the sintering material, or solder, is applied in a separate process. Specifically, the use of solder is expensive and increases the process and material costs.

SUMMARY OF THE INVENTION

The object of the invention is to provide a carrier or clip respectively for a semiconductor element, which in each case simplifies the production of a semiconductor component. The object of the invention is furthermore to provide a production method for such a carrier or clip, as well as a use and a sintering paste.

The invention is based on the concept of providing a carrier for at least one semiconductor element, which carrier has at least one functional surface for connection to the semiconductor element. According to the invention, the material of the carrier comprises a metal. A layer of a sinterable solidified paste, which contains silver and/or a silver compound and 0.1%-2% fatty acids or organic binder, is arranged on the functional surface. The carrier and the layer forming an intermediate product which can be connected to the semiconductor element.

The solidified paste contains silver and/or a silver compound. The paste furthermore contains 0.1%-2% fatty acids or organic binder. In other words, besides silver and/or a silver compound, the paste additionally contains 0.1%-2% fatty acids or organic binder. The solidified paste contains silver and/or a silver compound as well as 0.1%-2% fatty acids or organic binder.

The fatty acids may, for example, be caprylic acid (octanoic acid) and/or capric acid (decanoic acid) and/or lauric acid (dodecanoic acid) and/or myristic acid (tetradecanoic acid) and/or palmitic acid (hexadecanoic acid) and/or margaric acid (heptadecanoic acid) and/or stearic acid (octadecanoic acid) and/or arachidic acid (eicosanoic acid) and/or behenic acid (docosanoic acid) and/or lignoceric acid (tetracosanoic acid). The solidified paste preferably contains caprylic acid (octanoic acid) and/or lauric acid (dodecanoic acid) and/or myristic acid (tetradecanoic acid) and/or palmitic acid (hexadecanoic acid) and/or margaric acid (heptadecanoic acid) and/or stearic acid (octadecanoic acid).

The organic binder is preferably a polymer such as cellulose derivatives, for example methyl cellulose and/or ethyl cellulose and/or ethyl methyl cellulose and/or carboxymethylcellulose and/or hydroxypropyl cellulose.

The invention has the advantage that the carrier and the layer can be produced together, and they form a sinterable intermediate product. The sinterable intermediate product may be used by a further manufacturer in order to equip the carrier with the semiconductor element, so that only the connection by sintering between the carrier and the semiconductor element is then carried out. It has been found that it is less expensive for the carrier, or the lead frame, to be produced together with the sinterable layer and then subsequently connected to the semiconductor element.

With the layer formed from the sinterable solidified paste the carrier forms an intermediate product which can be handled separately and can be processed further in a temporally or spatially separate process.

Preferably, the carrier has at least one terminal, a further layer of a sinterable solidified paste, which contains silver and/or a silver compound and 0.1%-2% fatty acids or organic binder being arranged on the terminal on the side of the functional surface. The layer can be connected to a clip, in particular a clip as claimed in claim 5. This embodiment has the advantage that not only the functional surface, but in one working step also the terminal or a plurality of terminals can be provided with the sinterable layer, so that the production process is simplified further.

It has proven advantageous for the thickness of the layer to be from 5 µm to 100 µm, in particular from 5 µm to 50 µm.

The layer may contain silver particles having a particle size of from 200 nm to 20 µm.

In the scope of the invention, a clip for connection to a semiconductor element and a carrier is disclosed and claimed. The clip has the same features as the carrier, i.e. at least one functional surface for connection to the semiconductor element, the material of the clip comprising a metal. A layer of a sinterable solidified paste, which contains silver and/or a silver compound and 0.1%-2% fatty acids or organic binder, is arranged on the functional surface. The clip and the layer form an intermediate product which can be connected to the semiconductor element. The advantages explained in connection with the carrier also apply for the clip.

The paste contains silver and/or a silver compound. The paste furthermore contains 0.1%-2% fatty acids or organic binder. In other words, besides silver and/or a silver compound, the paste additionally contains 0.1%-2% fatty acids or organic binder. The solidified paste contains silver and/or a silver compound as well as 0.1%-2% fatty acids or organic binder.

The fatty acids may, for example, be caprylic acid (octanoic acid) and/or capric acid (decanoic acid) and/or lauric acid (dodecanoic acid) and/or myristic acid (tetradecanoic acid) and/or palmitic acid (hexadecanoic acid) and/or margaric acid (heptadecanoic acid) and/or stearic acid (octadecanoic acid) and/or arachidic acid (eicosanoic acid) and/or behenic acid (docosanoic acid) and/or lignoceric acid (tetracosanoic acid). The solidified paste preferably contains caprylic acid (octanoic acid) and/or lauric acid (dodecanoic acid) and/or myristic acid (tetradecanoic acid) and/or palmitic acid (hexadecanoic acid) and/or margaric acid (heptadecanoic acid) and/or stearic acid (octadecanoic acid).

The organic binder is preferably a polymer such as cellulose derivatives, for example methyl cellulose and/or ethyl cellulose and/or ethyl methyl cellulose and/or carboxymethylcellulose and/or hydroxypropyl cellulose.

Regarding the advantages of the embodiments of the clip, reference is made to the advantages disclosed and described in connection with the carrier.

The method according to the invention for producing the carrier for at least one semiconductor element, or the clip for connection to a semiconductor element, is based on the carrier or the clip being structured, in particular stamped, and having a functional surface for connection to the semiconductor element. A sintering paste, in particular a sintering paste containing silver, is applied onto the functional surface, and is heated for drying and solidification. As a result, a solidified and sinterable layer is formed on the functional surface of the carrier or clip. The intermediate product produced in this way is connected to the semiconductor element in a separate process.

Preferably, the functional surface is coated with a bonding agent, in particular with silver or a silver compound, before the sintering paste is applied. The sintering paste may be applied by a template printing method, in particular by a spraying method or a dispensing method.

Furthermore, the use of the carrier is disclosed and claimed in the scope of the invention. In addition, a sintering paste for application onto a carrier and/or onto a clip is disclosed and claimed, which is distinguished in that it can be applied onto the carrier.

BRIEF DESCRIPTION OF THE DRAWINGS

The invention will be explained in more detail below with the aid of an exemplary embodiment with reference to the appended drawings, in which.

DETAILED DESCRIPTION OF THE DRAWINGS

Figure 1:
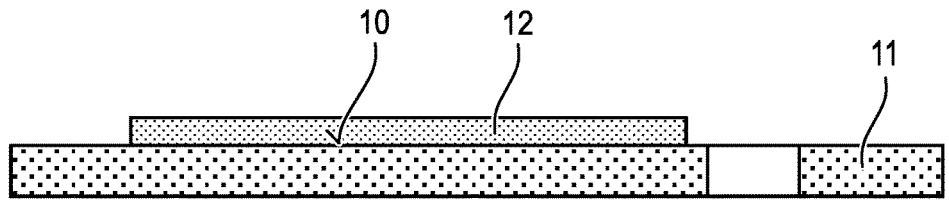
FIG. 1 shows a side view of a carrier or lead frame with an applied layer.

FIG. 1 shows a side view of a carrier or lead frame according to an exemplary embodiment according to the invention. The carrier is a stamped or etched part, which is produced by methods known per se. The carrier forms an intermediate product, which is connected to a semiconductor element, for example a chip, in a further separate method step. To this end, the carrier has a functional surface 10, on which the semiconductor element is placed. In order to connect the semiconductor element to the functional surface 10 of the carrier, a layer 12 which consists of a sinterable solidified paste is applied onto the functional surface 10. The layer 12 contains silver and/or a silver compound and 0.1%-0.2% fatty acids or organic binder.

In order to produce the layer 12, a sintering paste is applied onto the functional surface 10 in a preliminary process. The sintering paste is then dried. Liquid constituents are in this case removed at room temperature. The solidification, i.e. the drying of the paste, is carried out in such a way that full sintering of the paste does not occur. For this reason, the solidified paste, or the layer 12, has a residual reactivity for the sintering process subsequently carried out.

The drying of the paste is preferably carried out at a temperature, a pressure, an air humidity and for a time which are suitable for removing the solvents from the paste to the greatest possible extent, but without the sintering process already having fully taken place inside the paste after the drying. The drying may for example be carried out at temperatures below 200° C. and more preferably below 150° C., for example at about 120° C. for a time of preferably 3-60 minutes. Conventional drying apparatuses may be used for the drying.

The carrier with the layer 12 according to FIG. 1 therefore forms a preform, which is supplied as an intermediate product to the further production process, for example by another manufacturer. The intermediate product is stable overall, and can be handled in such a way that it can be transported for the further processing. This is because the originally wet sintering paste is solidified and is then geometrically stable at ambient temperature.

The C—Ag ratio of the layer lies in the range of C:Ag=1/1000-2/100. The particle size of the silver particles contained in the layer is from 200 nm to 20 μm.

Figure 2:
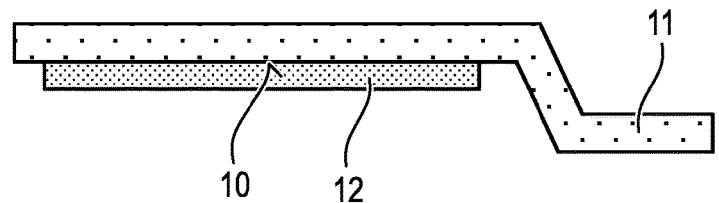
FIG. 2 shows a side view of a clip with an applied sinterable layer.

FIG. 2 represents a clip which, like the carrier according to FIG. 1, is provided with a solidified sinterable paste, or a corresponding layer 12. For the construction and production of the clip, reference is made to the comments in connection with FIG. 1.

Figure 3:
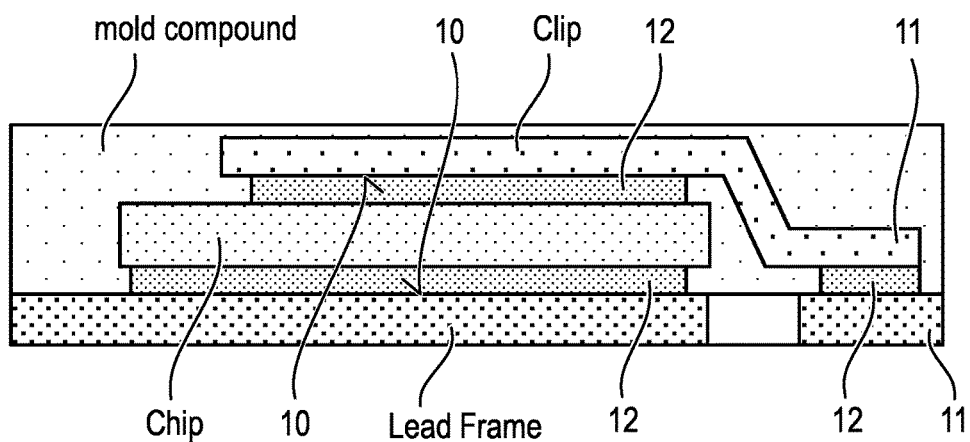
FIG. 3 shows a semiconductor component with a lead frame and a clip according to FIGS. 1, 2.

FIG. 3 shows the lead frame package after processing. In other words, the lead frame according to FIG. 1 and the clip according to FIG. 2 are respectively processed further as an intermediate product to form the package according to FIG. 3, specifically in a separate step. To this end, the clip according to FIG. 3 is connected and sintered to the lead frame and the clip in the manner shown in FIG. 3.

Sintering is intended to mean the connection of two components by heating while circumventing the liquid phase.

In FIG. 3, it can furthermore be seen that the lead frame has at least one terminal, which is connected to a corresponding terminal of the clip. The invention is carried out using a solidified sintering paste, which is applied as in the case of the intermediate products according to FIGS. 1, 2. In this case, the sintering paste or the solidified layer 12 may be applied either on the terminal 11 of the lead frame or on the terminal 11 of the clip, and thus form a part of the respective intermediate product. The layer arrangement consisting of the clip, chip or semiconductor element and lead frame or carrier is encapsulated in a further step with a so-called mold compound, so that the complete lead package is produced.

The invention, and the exemplary embodiments described above, have the advantage that the process and material costs are reduced.

What is claimed is:

1. A carrier for a semiconductor element, the carrier comprising:
   a functional surface for connecting to the semiconductor element;
   a body made of a metal material; and
   a first layer of a first sinterable solidified paste disposed on the functional surface, the first paste comprising
      silver and 0.1-2% fatty acids,
      a silver compound and 0.1-2% fatty acids,
      organic binder, or a combination of silver and silver compound and 0.1-2% fatty acids;
wherein the semiconductor element is connected to the carrier via the first layer.

2. The carrier as claimed in claim 1,
further comprising a second layer of a second sinterable solidified paste, the second paste comprising
silver and 0.1-2% fatty acids,
a silver compound and 0.1-2% fatty acids,
organic binder, or
a combination of silver and silver compound and 0.1-2% fatty acids;
further comprising at least one terminal, the second layer disposed on the at least one terminal on the side of the functional surface.

3. The carrier as claimed in claim 1, wherein a thickness of the first layer ranges from 5 µm to 100 µm.

4. The carrier as claimed in claim 1, wherein the first layer comprises silver particles having a particle size of from 200 nm to 20 µm.

5. The carrier as claimed in claim 1, wherein a thickness of the first layer ranges from 5 µm to 50 µm.

6. The carrier as claimed in claim 2, wherein a thickness of the second layer ranges from 5 µm to 100 µm.

7. In combination, a clip and a carrier for a semiconductor element, the combination comprising:
the clip comprising
a clip functional element for connecting to the semiconductor element;
a clip body made of a metal material;
a first clip layer disposed on the clip functional surface, the first clip layer being a first sinterable solidified paste, the first paste comprising
silver and 0.1-2% fatty acids,
a silver compound and 0.1-2% fatty acids,
organic binder, or
a combination of silver and silver compound and 0.1-2% fatty acids;
the carrier comprising
a carrier functional surface for connecting to the semiconductor element;
a carrier body made of the metal material; and
a first carrier layer disposed on the carrier functional surface, the first carrier layer being the first sinterable solidified paste;
wherein the semiconductor element is connected to the clip via the first clip layer.

8. The combination of claim 7;
further comprising a second clip layer, the second clip layer comprising a second sinterable solidified paste, the second paste comprising
silver and 0.1-2% fatty acids,
a silver compound and 0.1-2% fatty acids,
organic binder, or
a combination of silver and silver compound and 0.1-2% fatty acids;
further comprising at least one terminal, the second clip layer disposed on the at least one terminal on the side of the clip functional surface.

9. The combination of claim 7, wherein a thickness of the first clip layer ranges from 5 µm to 100 µm.

10. The combination of claim 7, wherein the first clip layer comprises silver particles having a particle size of from 200 nm to 20 µm.

11. The combination of claim 7, wherein a thickness of the first clip layer ranges from 5 µm to 50 µm.

12. The combination of claim 7, wherein a thickness of the second clip layer ranges from 5 µm to 50 µm.

13. A method for producing a carrier for at least one semiconductor element,
the carrier comprising
a functional surface for connecting to the semiconductor element;
a body made of metal material; and
a first layer of a first sinterable solidified paste disposed on the functional surface, the first paste comprising
silver and 0.1-2% fatty acids,
a silver compound and 0.1-2% fatty acids,
organic binder, or
a combination of silver and silver compound and 0.1-2% fatty acids;
wherein the semiconductor element is connected to the carrier via the first layer;
the method comprising:
(a) forming the functional surface of the carrier;
(b) applying the first paste to the functional surface; and
(c) heating the first paste to dry and solidify the first paste.

14. The method as claimed in claim 13, further comprising the step of
coating the functional surface with a bonding agent before step (b), the bonding agent comprising silver or silver compound.

15. The method as claimed in claim 13, wherein step (b) is performed by a template printing method.

16. The method as claimed in claim 13, wherein step (b) is performed by a spraying method.

17. The method as claimed in claim 13, wherein step (b) is performed by a dispensing method.

* * * * *